United States Patent [19]

Flohrs et al.

[11] Patent Number: 4,886,985
[45] Date of Patent: Dec. 12, 1989

[54] TRANSISTOR ARRANGEMENT WITH AN OUTPUT TRANSISTOR

[75] Inventors: Peter Flohrs; Klaus Heyke; Hartmut Michel, all of Reutlingen; Ulrich Nelle, Sonnenbühl, all of Fed. Rep. of Germany

[73] Assignee: Robert Bosch GmbH, Stuttgart, Fed. Rep. of Germany

[21] Appl. No.: 307,089
[22] PCT Filed: May 9, 1987
[86] PCT No.: PCT/DE87/00217
§ 371 Date: Dec. 23, 1988
§ 102(e) Date: Dec. 23, 1988
[87] PCT Pub. No.: WO88/00413
PCT Pub. Date: Jan. 14, 1988

[30] Foreign Application Priority Data
Jun. 26, 1986 [DE] Fed. Rep. of Germany ....... 3621396

[51] Int. Cl.[4] .................. H03K 3/26; H03K 3/013; H03K 17/60
[52] U.S. Cl. .................................. 307/315; 307/255; 307/270; 307/300
[58] Field of Search ............... 307/315, 270, 254, 300, 307/255

[56] References Cited
U.S. PATENT DOCUMENTS 4,128,742 12/1978 Davis .................... 307/315
4,234,805 11/1980 Carlsen, II ............ 307/254
4,616,144 10/1986 Hideshima et al. ..... 307/315
4,695,807 9/1987 Annacker et al. ...... 307/315

Primary Examiner—Stanley D. Miller
Assistant Examiner—Nancy Thai
Attorney, Agent, or Firm—Michael J. Striker

[57] ABSTRACT

A transistor arrangement, particularly for the fast switching of inductive loads, includes a driving first transistor and a power output second transistor (T1, T2) interconnected as a Darlington pair having a base terminal, an emitter terminal and a collector terminal. A third transistor (T3) has its collector connected to the base of the first transistor (T1) and its emitter connected to the emitter terminal (E). A fourth transistor (T4) of a conductivity type opposite to that of the first, second and third transistors has its base connected to the collector terminal, its emitter connected to the base terminal, and its collector connected to the base of the third transistor (T3). This structure is particularly suited for a monolithic integration.

4 Claims, 1 Drawing Sheet

TRANSISTOR ARRANGEMENT WITH AN OUTPUT TRANSISTOR

PRIOR ART

The invention is based on a transistor arrangement serving as an output transistor, particularly for switching inductive loads.

A transistor circuit arrangement with a power transistor designed as a Darlington transistor is already known from the DE-OS No. 34 39 366. The transistor arrangement serves as an ignition output stage for controlling transistor ignitions in motor vehicles. For this purpose, the primary winding of an ignition coil is connected in the collector-emitter circuit of the power transistor. According to the law of induction, it is necessary to switch off the current through the primary winding of the ignition coil as quickly as possible in order to achieve the highest possible ignition voltage at the secondary side of the ignition coil.

As is known, when switching off a transistor, a certain time passes until the transistor has achieved its full blocking ability after the controlling of the base is terminated. This turn-off timee is caused primarily by charge carriers stored in the base region of the transistor. One also often speaks of a charged collector-base capacity of the transistor. The turn-off time of the transistor is therefore relatively long if, in order to switch off the collector current, the base current is simply interrupted. It can be clearly reduced if the charge carriers stored in the transistor are removed by means of a reversal of the base current. The same is also true for power transistors in Darlington circuits, wherein, however, the minimum switching time can only be achieved when not only the base of the driver transistor but also the base of the output transistor is dicharged. In many cases of the application, however, it is not possible to reverse the base current in order to achieve a quick cut-off process for reasons relating to circuit technology.

Therefore, it is the object of the present invention to find a transistor arrangement with a power transistor which enables a turn-off time of the power transistor which is as short as possible, even when the base current is only interrupted for switching off.

The object is met by means of the transistor arrangement, according to the invention, wherein a first- and a second transistor are interconnected as a Darlington pair having a base terminal, an emitter terminal and a collector terminal; a third transistor having its collector connected to the base of the first transistor and its emitter connected to the emitter terminal; and a fourth transistor of a conductivity type opposite to that of the first, second and third transistors and having its base connected to the collector terminal, its emitter connected to the base terminal, and its collector connected to the base of the third transistor.

ADVANTAGES OF THE INVENTION

The transistor arrangement, according to the invention, has the particular advantage that it is monolithically integrable in a very simple manner. Since its function is substantially independent of the respective transistor data, it has a very small dispersion of turn-off time within a series. It can therefore be used particularly reliably where a high demand for quality is placed on the tolerance of the turn-off time, that is, particularly when it is used as an ignition output stage for controlling transistor ignitions in motor vehicles. It is particularly advantageous when a follower transistor, which takes over the actual discharging function, is connected downstream of the discharging transistor. Accordingly, the discharging transistor serves only to control the follower transistor and can therefore be realized in monolithic integrated technology so as to be particularly small and low in output, accompanied by the use of structural component elements adjoining diffusion regions. In addition, it is particularly advantageous if the Darlington pair has its base-emitter diodes bridged by means of parallel resistors. The base regions of the transistors in the Darlington pair are then also discharged via the resistors and a short turn-off time is achieved.

DRAWING

An embodiment example of the invention is shown in the drawing and explained in more detail in the following description.

FIG. 1 shows a wiring diagram of the embodiment example, while

DESCRIPTION OF THE EMBODIMENT EXAMPLE

Figure 1:
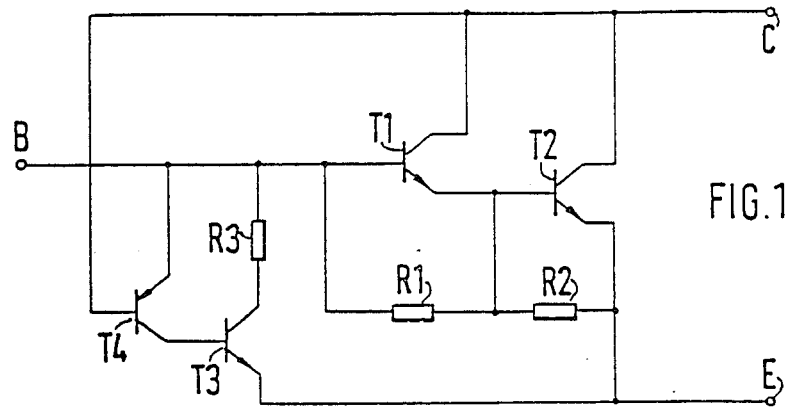

The wiring diagram of a transistor arrangement comprising a base terminal B, a collector terminal C and an emitter terminal E is shown in FIG. 1. The transistor arrangement comprises an output-stage Darlington transistor pair, comprising a driver transistor T1 and a power transistor T2. The collectors of the transistors T1, T2 are jointly connected to the collector terminal C. The base of the driver transistor T1 leads to the base terminal B, while its emitter is connected with the base of the power transistor T2. The emitter of the power transistor T1, on the other hand, leads to the emitter terminal E. A resistor R1 is connected parallel to the base-emitter diode of the driver transistor T1, while a resistor R2 is connected parallel with the base-emitter diode of the power transistor T2 in a corresponding manner. A resistor R3 leads from the base terminal B to the collector of a transistor T3, which is controlled as a follower transistor by a discharging transistor T4. For this purpose, the follower transistor T3 is connected to the collector of the discharging transistor T4 by the base, while the emitter of the follower transistor T3 is connected to the emitter terminal E. The emitter of the discharging transistor T4 is connected with the base terminal B, while its base is connected with the collector terminal C. The conductivity type of the transistor T4 is opposed to the conductivity type of the transistors T1, T2, T3.

The manner of operation of the output-stage Darlington transistor pair T1, T2 and the resistors R1, R2 is known to the person skilled in the art and is not explained in more detail for the sake of simplicity.

The turn-off time of a power transistor is highly dependent on the level of overdrive or saturation in the switched on state. The overdrive is dependent on the amplification of the power transistor and, like the latter, is therefore subject to strong sample dispersions. The driver transistor T1 can be fully controlled by means of the discharging transistor T4 and the follower transistor T3, but it does not reach overdrive. When the potential at the collector terminal C reaches the vicinity of the emitter potential of the driver transistor T1, the discharging transistor T4, and accordingly the follower transistor T3, is controlled. Base current then flows from the base of the driver transistor T1 over the resistor R3 and the collector-emitter junction of the transistor T3, so as to counteract an overdrive.

After switching off the base current at the base terminal B, there are still charge carriers in the base regions of the transistors. As a result of the stored charge in the base region of the follower transistor T3, the transistor T3 still remains controlled for a certain length of time. Accordingly, the base region of the transistor T1 is cleared, and the base region of the transistor T2 is cleared via the resistors R1 and R2. A maximum shortening of the turn-off time of the entire transistor arrangement is accordingly achieved.

Figure 2:
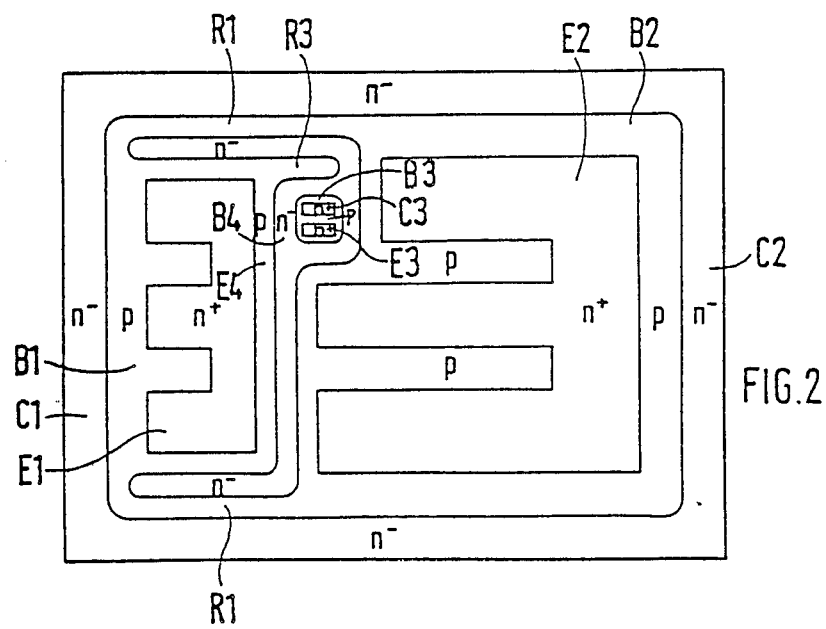
FIG. 2 shows a possible diffusion structure on a substrate.

FIG. 2 shows a diffusion structure of a monolithic integration of the circuit shown in FIG. 1, as it could appear prior to applying the metallic connection network on the surface under a microscope. The substrate for forming the common collector is negatively doped and comprises a metallization on the rear side, not shown, for the electrical connection with the collector terminal C. Accordingly, the right-hand outer portion of the diffusion structure shown in FIG. 2 is the collector region C2 of the power transistor T2, while the left-hand outer portion is correspondingly the collector region C1 of the driver transistor T1. Positively doped base regions are subsequently introduced into the collector regions. Te geometric shape of the base regions arises by means of masking the regions which are not to be changed. And, specifically, the base region B1 of the driver transistor T1 on the left-hand side of FIG. 2 and the base region B2 of the power transistor T2 on the right-hand side of FIG. 2 arise simultaneously, and the base region B3 of the follower transistor T3 arises, which is arranged between the base regions B1, B2. The base region B1 is connected with the base regionn B2 via two narrow external webs. The resistor R1 is formed by means of the webs. A portion of the base region B1 adjoining the base region B3 is, at the same time, the emitter E4 of the discharging transistor T4. The negatively doped region of the collector substrate located between the latter is the base region B4 of the discharging transistor T4. In this way, the collector of the discharging transistor T4 is represented by the base region B3 of the follower transistor T3 without a separate diffusion being necessary.

Emitter regions which are strongly negatively doped are introduced in a known manner into the positively doped base regions B1, B2, B3. The emitter E1 of the driver transistor T1 is shown on the left-hand side of FIG. 2. The emitter E2 of the power transistor T2 is correspondingly shown on the right-hand side. Collector C3 and emitter E2 of the follower transistor T3 are formed by means of two adjacent small regions within the base region B3. The resistor R3 is formed by means of a small bulge of the base region B1. A small metallic connection, not shown in FIG. 2, is connected to the collector region C3 of the follower transistor T3. The resistor R2, not shown in FIG. 2, arises by means of a small short circuit at a portion of the base-emitter junction of the power transistor T2 located at the surface of the substrate. A particularly small surface area requirement on the substrate is thus achieved by means of the integration of the Darlington output transistor as vertical structure and the discharging transistor with follower transistor as adjacent horizontal structure.

We claim:

1. Transistor arrangement, particularly for the fast switching of inductive loads, comprising a first transistor (T1) and a second transistor (T2) interconnected as a Darlington pair having a base terminal, an emitter terminal and a collector terminal; a third transistor (T3) having its collector connected to the base of the first transistor (T1) and its emitter connected to the emitter terminal (E); and a fourth transistor (T4) of a conductivity type opposite to that of the first, second and third transistors and having its base connected to the collector terminal (C), its emitter connected to the base terminal (B), and its collector connected to the base of the third transistor (T3).

2. Transistor arrangement according to claim 1, wherein a protective resistor (R3) is connected between the collector of the third transistor (T3) and the base terminal (B).

3. Transistor arrangement according to claim 2, wherein the first transistor (T1) is a driver transistor and the second transistor (T2) is a power transistor.

4. Transistor arrangement according to claim 3, wherein an auxiliary resistor (R1, R2) is connected in parallel to each of the base-emitter diodes of the Darlington pair.

* * * * *